(12) United States Patent
Marasch et al.

(10) Patent No.: US 6,686,730 B2
(45) Date of Patent: Feb. 3, 2004

(54) SNAP FIT HALL EFFECT CIRCUIT MOUNT APPARATUS AND METHOD

(75) Inventors: Richard Marasch, Germantown, WI (US); Jeff Annis, Waukesha, WI (US); Bob Rushmer, Wauwatosa, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 10/167,377

(22) Filed: Jun. 11, 2002

(65) Prior Publication Data

US 2003/0227285 A1 Dec. 11, 2003

(51) Int. Cl.[7] ............................................... G01R 33/00
(52) U.S. Cl. ............................... 324/117 R; 324/117 H
(58) Field of Search ........................ 324/117 R, 117 H, 324/158.1; 338/32 R, 32 H (56) References Cited

U.S. PATENT DOCUMENTS

| | | | |
|---|---|---|---|
| 4,893,073 A | | 1/1990 | McDonald et al. |
| 5,180,970 A | * | 1/1993 | Ross ....................... 324/117 H |
| 5,416,407 A | | 5/1995 | Drafts |
| 5,552,700 A | * | 9/1996 | Tanabe et al. ........... 324/117 H |
| 6,005,383 A | * | 12/1999 | Savary et al. ............ 324/117 H |
| 6,426,617 B1 | * | 7/2002 | Haensgen et al. ....... 324/117 H |
| 6,429,639 B1 | * | 8/2002 | Pelly ....................... 324/117 H |
| 6,566,856 B2 | * | 5/2003 | Sandquist et al. ....... 324/117 R |

* cited by examiner

*Primary Examiner*—Evan Pert
*Assistant Examiner*—Tung X. Nguyen
(74) *Attorney, Agent, or Firm*—Quarles & Brady LLP; Alexander M. Gerasimow (57) ABSTRACT

A method and apparatus for sensing magnetic field flux formed by current passing through a conductor, the apparatus comprising a rigid magnetically permeable core extending between facing first and second ends and formed about a conductor receiving space, the first and second ends forming first and second guide couplers, respectively, and defining a mounting gap therebetween having a mounting gap dimension, a resilient clip member including first and second clip couplers at oppositely facing first and second edges, respectively, the first and second guide couplers operably receiving the first and second clip couplers, respectively, to mount the clip within the mounting gap with a sensing space formed on a first side of the clip member between the first and second ends and a magnetic flux sensor mounted to the first side of the clip member substantially within the sensing space.

37 Claims, 6 Drawing Sheets

SNAP FIT HALL EFFECT CIRCUIT MOUNT APPARATUS AND METHOD

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

The field of the invention is Hall effect current sensors and more specifically methods and apparatus for mounting a magnetic field sensor within a gap formed by a core or flux guide that surrounds a conductor.

When current passes through a conductor, the current generates a magnetic field including flux that encircles the conductor and that is directed along flux lines in a direction consistent with the well known right hand rule. The field strength is strongest at locations in close proximity to the conductor. The magnitude of current passing through the conductor is directly proportional to the total strength of the magnetic field generated thereby. Thus, if the magnetic flux generated by the current can be accurately determined, then the magnitude of the current passing through that conductor can also be determined.

One way to determine the magnetic flux and hence conductor current has been to design a sensor configuration that relies upon the well known Hall effect electromagnetic principle. To this end, in 1879, Edwin Hall discovered that equal-potential lines in a current carrying conductor are skewed when put in the presence of a magnetic field. This effect was observed as a voltage (Hall voltage) perpendicular to the direction of current flow. Today, Hall effect devices for measuring the Hall voltage and hence a corresponding magnetic field are packaged as single Hall effect chips and are sold as high volume commodity items.

A typical current sensor utilizing Hall effect technology consists of a toroid or rectangular shaped gapped core and a Hall effect chip. Exemplary cores typically include either a laminated stack or a high resistivity solid ferrite material designed to prevent unwanted eddy currents. A single current carrying conductor is positioned within the core such that the permeable core directs the magnetic flux through the core and across the gap. A Hall effect chip is placed within the gap to sense the flux density passing there across. In a well-designed Hall effect current sensor, the measured flux density is linear and directly proportional to the current flowing through the current carrying conductor.

One design challenge routinely faced when designing Hall effect sensors has been finding a cost effective and mechanically robust way in which to mount the Hall effect chip within a core gap. One other challenge has been to configure a sensor that has a relatively small volume footprint. With respect to cost, as with most mechanical products, minimal piece count, less and simplified manufacturing steps and less manufacturing time are all advantageous. With respect to robustness, many Hall effect sensors are designed to be employed in rugged environments such as industrial control applications where shock and vibration are routine.

The industry has devised several Hall effect sensor configurations. For instance, in one configuration, a donut shaped and gapped ferrite core is positioned over a vertically mounted Hall effect chip which is soldered to a circuit board. In this case the ferrite core is typically manually positioned with respect to the chip and is then glued to the circuit board. While this solution can be used to provide a robust sensor configuration, this solution has several shortcomings. First, sensor manufacturing experience has revealed that it is relatively difficult to accurately position and glue a donut shaped core relative to the circuit board mounted Hall effect chip. Also, in this regard, where the sensor is subjected to vibrations and shock, any loosening or shifting of the bond between the core and board can compromise the accuracy of the current sensor.

Second, the manual labor to glue a core to a board is not very efficient or cost effective and the glue curing cycle is typically relatively long. Labor and curing costs increase the overall costs associated with providing these types of Hall effect current sensors.

One other approach to mounting a Hall effect chip within a core gap has been to mount the chip on a board, position the core in a housing cavity with the circuit board mounted chip appropriately juxtaposed within the gap, fill the cavity with epoxy potting compound and bake the filled housing for several hours to completely cure the epoxy. As in the case of the glued donut shaped core, the manual labor required to pot the core and board is relatively expensive. Moreover, the baking time required to cure the epoxy reduces manufacturing throughput. Furthermore, the requirement for a housing increases parts count and hence overall configuration costs.

Yet one other approach to mounting a Hall effect chip within a core gap has been to mount a circuit board within a bobbin and mount a Hall effect chip to the circuit board where right angle pin connectors from the chip protrude out of apertures in the bobbin for connection to one or more other circuit boards. A core lamination stack is inserted into the bobbin with the bobbin formed to arrange the core and chip with respect to each other such that the chip is within the gap. Thereafter, the bobbin, core, chip and board are inserted into a first piece of a housing with the pin connectors protruding out housing apertures and a second housing piece is snapped together with the first piece to secure all of the components inside. The housed configuration forms a complete Hall effect current sensor.

This solution, unfortunately, requires a relatively large number of components and therefore increases costs appreciably. In addition, the pin connectors used with this type of assembly are relatively flimsy and have been known to break when used in typical industrial environments. Moreover, the pin connectors are often bent prior to installation or may be located imperfectly and therefore make installation relatively difficult. Furthermore, if the laminations are not clamped tightly by the housing, the laminations may shift laterally or rotate within the housing due to shock or vibrations. Such shifting and rotation will often result in changing the size of the core gap which alters the sensitivity of the sensor configuration.

Thus, prior approaches for securing Hall effect chips within core gaps have each had one or more shortcomings and therefore it would be advantageous to have an apparatus and method for mounting chips within gaps that is simple, inexpensive and robust.

BRIEF SUMMARY OF THE INVENTION

It has been recognized that a robust and relatively inexpensive apparatus can be provided to secure a sensing chip within a flux guide or core gap which reduces the costs associated with manufacturing Hall effect type current sensors and that overcomes many of the shortcomings described above. To this end, generally, a small circuit board member referred to generally herein as a clip member, is configured to which a flux sensor is mounted. The edges of the clip member and the facing ends of the permeable core are configured such that they form couplers that cooperate to mechanically mount the clip and an attached sensor within the gap. More specifically, the clip edges are formed so as to be resiliently temporarily deformable so that the clip member can be forced into the gap between the guide ends. The clip edges also generally are formed with some type of restraining and/or retaining members that cooperate with structure formed by the guide ends to essentially eliminate relative movement between the clip and the core.

Thus, the present invention is an extremely inexpensive solution for mounting a magnetic field sensor within an air gap of a permeable core. In addition, the inventive solution is completely mechanical and therefore messy potting and epoxy steps are not necessary. Furthermore, the inventive solution is extremely quick to configure and hence manufacturing time required to employ the solution is minimized thereby further reducing solution costs.

Consistent with the above discussion, the present invention includes, among other things, sensor apparatus for sensing magnetic field flux formed by current passing through a conductor, the apparatus comprising a rigid flux guide core extending between facing first and second ends and formed about a conductor receiving space, the first and second ends forming first and second guide couplers, respectively, and defining a mounting gap there between having a mounting gap dimension, a resilient clip member including first and second clip couplers at oppositely facing first and second edges, respectively, the first and second guide couplers operably receiving the first and second clip couplers, respectively, to mount the clip within the mounting gap with a sensing space formed on a first side of the clip member between the first and second ends and a sensor mounted to the first side of the clip member substantially within the sensing space.

The invention also includes a method for use with a rigid guide core extending between facing first and second ends and formed about a conductor receiving space, the first and second ends forming first and second guide couplers, respectively, and defining a mounting gap therebetween having a mounting gap dimension, the method also for use with a sensor mounted to a resilient clip member including first and second clip couplers at oppositely facing first and second edges, respectively, the method for configuring a flux sensing assembly for sensing the flux generated by a current passing through a conductor, the method comprising the steps of positioning the conductor within the conductor receiving space and engaging the first guide and first clip couplers and the second guide and second clip couplers to secure the clip member between the first and second ends with the sensor substantially residing between the first and second ends.

In addition, the invention includes a method for configuring a sensor assembly for sensing the flux of a magnetic field formed by current passing through a conductor, the method comprising the steps of providing a rigid guide core extending between facing first and second ends and formed about a conductor receiving space, the first and second ends forming first and second guide couplers, respectively, and defining a mounting gap therebetween having a mounting gap dimension, providing a resilient clip member including first and second clip couplers at oppositely facing first and second edges, respectively, the first and second guide couplers configured to operably receive the first and second clip couplers, respectively, to mount the clip within the mounting gap with a sensing space formed on a first side of the clip member between the first and second ends, mounting a sensor to the first side of the clip member, positioning the conductor within the conductor receiving space and engaging the first guide and first clip couplers and the second guide and second clip couplers to secure the clip member between the first and second ends with the sensor substantially residing between the first and second ends.

Moreover, the invention includes a sensor mounting apparatus for use with a rigid guide core extending between facing first and second ends and formed about a conductor receiving space, the first and second ends forming first and second guide couplers, respectively, and defining a mounting gap therebetween having a mounting gap dimension, the apparatus for mounting a flux sensor within the gap, the apparatus comprising a resilient clip member including first and second clip couplers at oppositely facing first and second edges, respectively, the first and second clip couplers formed so as to be operably received by the first and second guide couplers, respectively, to mount the clip within the mounting gap with a sensing space formed on a first side of the clip member between the first and second ends, the first side formed to receive the sensor.

These and other objects, advantages and aspects of the invention will become apparent from the following description. In the description, reference is made to the accompanying drawings which form a part hereof, and in which there is shown a preferred embodiment of the invention. Such embodiment does not necessarily represent the full scope of the invention and reference is made therefore, to the claims herein for interpreting the scope of the invention.

DETAILED DESCRIPTION OF THE INVENTION

Referring now to the drawings and, more specifically referring to FIGS. 1 through 6, a first embodiment 10 of the present invention includes, generally, a permeable guide core 12 and a sensor assembly 60. Core 12 includes a plurality of metallic laminations stacked together to form a substantially "C" shaped core having parallel members 16 and 20, a substantially elongated and straight member 18 that traverses the distance between adjacent ends of parallel members 16 and 20 and relatively shorter members 14 and 22 that extend from ends of members 16 and 20 opposite member 18 and toward each other. Members 14 and 22 terminate at distal and facing first and second core ends 25 and 27, respectively, that form a gap therebetween. Thus, members 14, 15, 16, 18, 20 and 22 together form a core around a space 26. When mounted to a conductor, the conductor is positioned so as to pass through space 26. Hereinafter, space 26 will be referred to as a conductor receiving space. Core 14 is characterized by a core thickness $T_g$. (see FIG. 6) that corresponds to the combined thickness of the laminates used to construct core 12.

Figure 1:
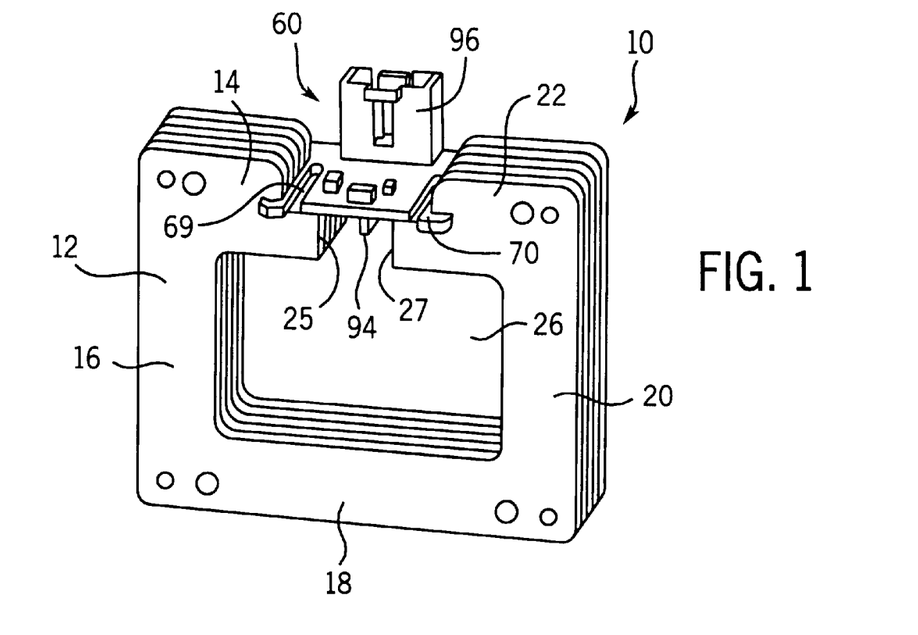
FIG. 1 is a perspective view of a first Hall effect type current sensor embodiment.
Figure 5:
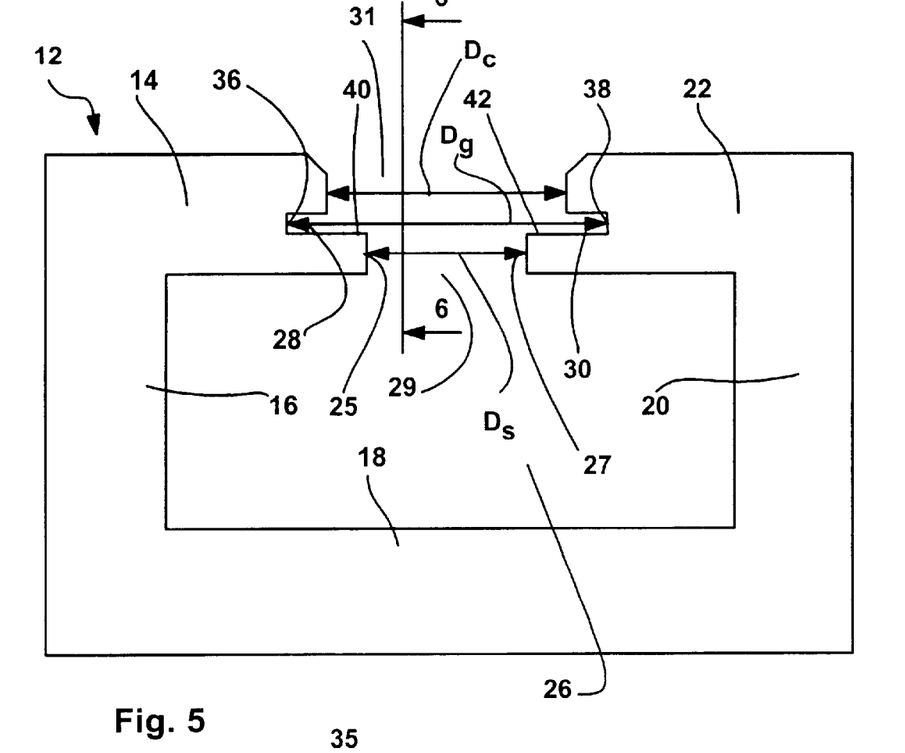
FIG. 5 is a side elevational view of the guide core of FIG. 1.
Figure 6:
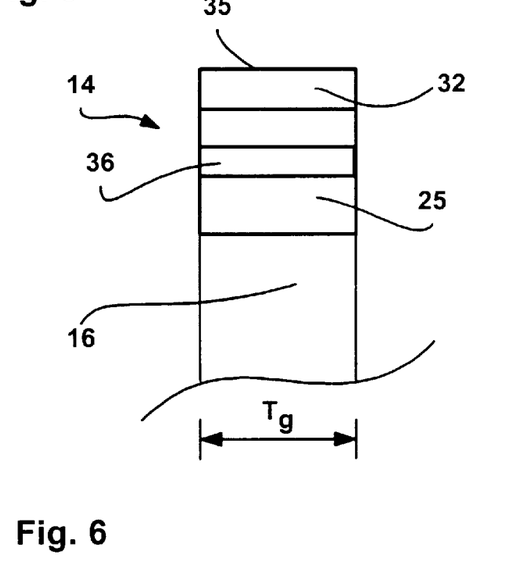
FIG. 6 is a partial view of one end of the core of FIG. 5 taken along the lines 6—6.
Figure 7:
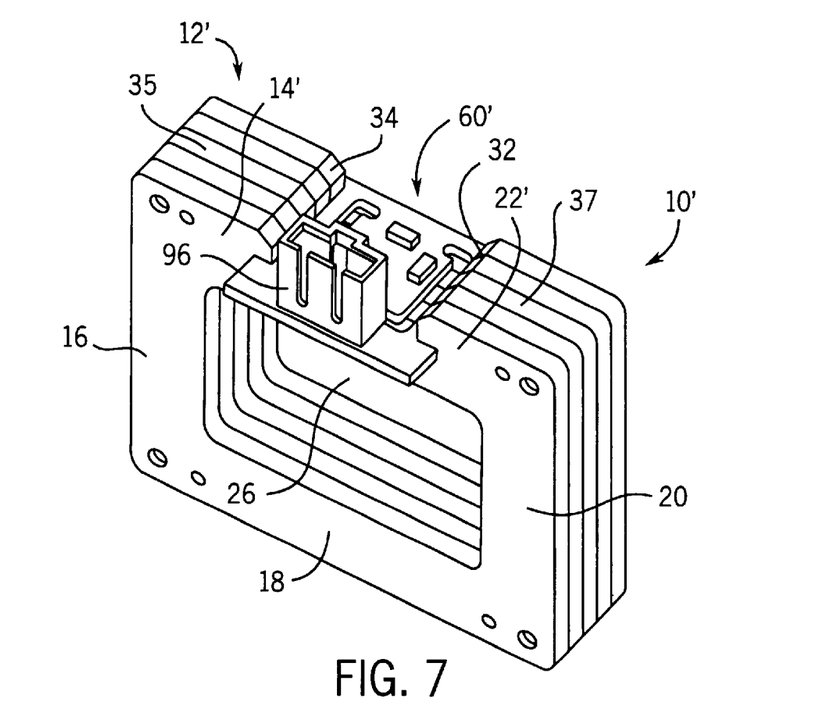
FIG. 7 is a perspective view similar to FIG. 1, albeit illustrating a second embodiment of a inventive Hall effective type sensor.

Referring specifically to FIGS. 1 and 5, first and second passageways or recesses 28 and 30 are formed in the first and second ends 28 and 30, respectively, such that the passageways 28 and 30 form substantially parallel and oppositely facing elongate internal surfaces 36 and 38, respectively. Each of the internal surfaces 36 and 38 extends generally across the thickness $T_g$ (see FIG. 6 again) of a corresponding end (e.g., 25, 27). The facing internal surfaces 36 and 38 generally define a gap dimension $D_g$. The space between ends 25 and 27 that is bounded on one side by the conductor receiving space 26 and bounded on the other side by passageways 28 and 30 will be referred to hereinafter as a sensor receiving space 29 while the space between ends 25 and 27 and on a side of passageways 28 and 30 opposite sensor receiving space 29 will be referred to hereinafter as a circuit receiving space 31. As best illustrated in FIG. 5, ends 25 and 27 extend further toward each other proximate sensor receiving space 29 than they do proximate circuit receiving space 31. Thus, looking into the gap formed by ends 25 and 27, shelf surfaces 40 and 42 formed by ends 25 and 27 proximate space 29 are observable and a sensor receiving dimension $D_s$ corresponding to sensor receiving space 29 is smaller than a circuit receiving space dimension $D_c$ corresponding to circuit receiving space 31. As illustrated, gap dimension $D_g$ is greater than each of dimensions $D_c$ and $D_s$. The dimension between shelf surface 40 and space 26 (i.e., the vertical dimension of end 25 along space 29) must be large enough to accommodate flux sensor 94 when assembly 60 is mounted as illustrated in FIG. 1.

Referring again to FIGS. 1 through 4, assembly 60 includes a clip member 51, a plug receiving socket 96, circuit components 100 and a flux sensor 94. Clip member 51 is a substantially flat and relatively thin lightweight member which is typically formed of some type of circuit board material. Member 51 is generally rectangularly shaped and forms first and second oppositely facing edges 64 and 66 and third and fourth oppositely facing edges 76 and 78 and has first and second oppositely facing sides 92 and 98, respectively. First side 92 of member 51 is formed in any manner well known in the art for mounting sensor 94 via soldering or some other mounting process. Similarly, second side 98 is constructed and designed to receive various circuit components 100 and also to receive plug socket 96 which, as its label implies, is configured to receive a plug for linking sensor 94 and other circuit components 100 to other circuitry. Sensor 94 and components 100 are operably linked via circuit board runs to socket 96. In at least one embodiment clip member 51 extends laterally such that when placed within the gap between ends 25 and 27, a portion is laterally outside the gap. Here, socket 96 (see FIG. 1) may be mounted to the laterally extending portion so that plug 96 resides outside the gap.

Figure 2:
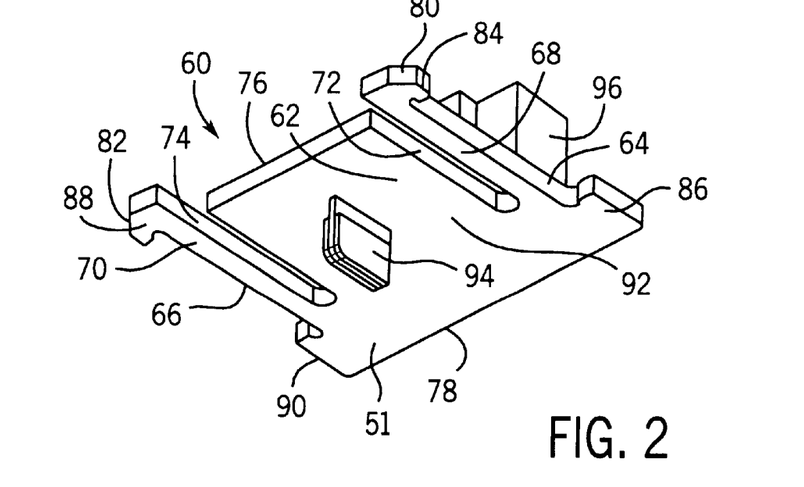
FIG. 2 is a perspective view of the clip assembly illustrated in FIG. 1.
Figure 3:
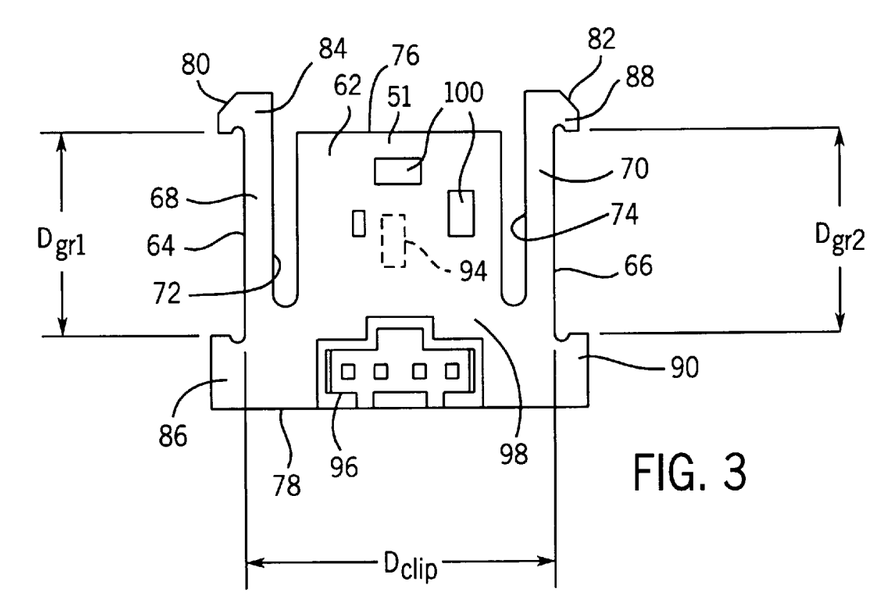
FIG. 3 is a top plan view of the clip assembly of FIG. 2.
Figure 4:
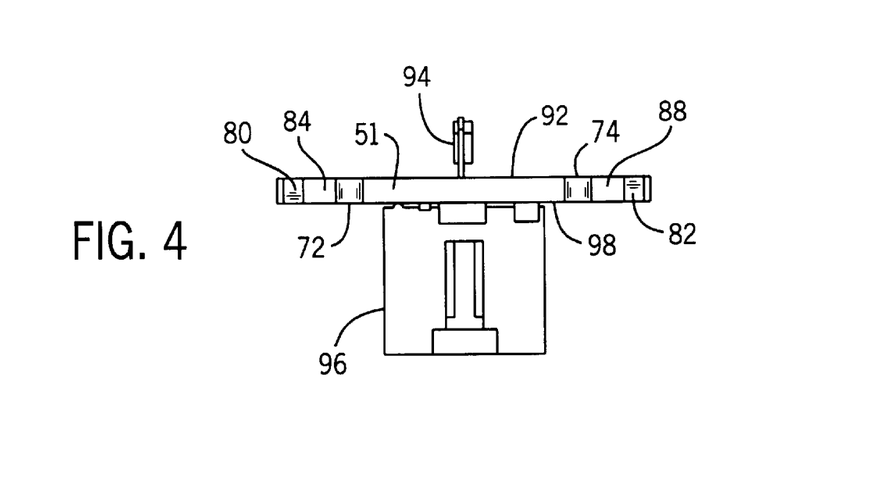
FIG. 4 is a side plan view of the clip assembly illustrated in FIG. 2.

Clip member 51 forms first and second elongate slots 72 and 74 that are substantially parallel to edges 64 and 66, respectively, that are closed proximate fourth edge 78 and that are open proximate third edge 76. With slots 72 and 74 formed as described above, in effect, first and second leg members 68 and 70 are formed that are separated from a body member 62 where leg members 68 and 70 are generally resiliently flexible so that they can be temporarily deformed by pushing inwardly on the distal ends thereof. Hereinafter, the ends of leg members 68 and 70 that are connected proximate fourth edge 78 to body member 62 will be referred to as proximal ends and the unconnected ends of leg members 68 and 70 proximate third edge 76 will be referred to as distal ends.

Referring still to FIGS. 2, 3 and 4, first and second restraining members 84 and 86 extend laterally from the distal and proximal ends of leg member 68 in a direction away from leg member 70. Similarly, third and fourth restraining members 88 and 90, respectively, extend laterally and in the same direction from the distal and proximal ends of leg member 70 in a direction away from first leg member 68. First and second restraining members 84 and 86 have facing surfaces that define a first guide receiving dimension $D_{gr1}$ where dimension $D_{gr1}$ is substantially equal to or slightly greater than the guide thickness $T_g$ (see FIG. 6). Similarly, third and fourth restraining members 88 and 90 form facing surfaces that define a second guide receiving dimension $D_{gr2}$ where dimension $D_{gr2}$ is substantially similar to guide thickness $T_g$. Moreover, referring still to FIG. 3, clip member 51 is dimensioned such that edges 64 and 66 define a clip dimension $D_{clip}$ substantially equal to the gap dimension $D_g$ illustrated in FIG. 5. In the embodiment illustrated, the distal ends of leg members 68 and 70 are tapered toward each other so as to form sloped bearing surfaces 80 and 82 which help to facilitate temporary deformation during insertion of member 51 between core ends 25 and 27.

With the core 12 and clip assembly 60 configured in the manner described above with sensor 94 mounted to first side 92, assembly 60 can be attached within the gap between ends 25 and 27 in the following manner. First, clip member 51 is aligned such that bearing surfaces 80 and 82 are proximate internal surfaces 36 and 38 and, in fact, bear there against. In this case, the edges of surfaces 36 and 38 that surfaces 80 and 82 bear against operate as core bearing surfaces. With clip member 51 so aligned, clip member 51 is forced along a trajectory parallel with passageways 28 and 30 such that force is applied against bearing surfaces 80 and 82 causing leg members 68 and 70 to temporarily flex or deform inwardly toward each other. Eventually, leg members 68 and 70 flex inwardly to the point where restraining members 84 and 88 are forced into and along passageways 28 and 30. Eventually, restraining members 84 and 88 are forced to the opposite ends of passageways 28 and 30 and extend therefrom. At this point, the deforming force against bearing surfaces 80 and 82 ceases and leg members 68 and 70 resiliently spring back to their original configurations. In this case, edges 64 and 66 are received within passageways 28 and 30 such that restraining members 84 and 86 and 88 and 90 maintain clip assembly 60 within the sensing gap.

Referring now to FIGS. 7 through 12, a second embodiment 10' of the invention is illustrated. Many of the components and elements of second embodiment 10' are similar to the components described above with respect to first embodiment 10 and therefore, in the interest of simplifying this explanation, similar elements are identified via similar numbers. Where an element in the second embodiment is similar to one of the elements in the first embodiment yet has some distinction that is meaningful from the perspective of the present invention, that element is identified by the same numeral as the element in the first embodiment above followed by a prime.

Embodiment 10' includes a guide core 12' and a clip assembly 60'. Core 12', like member 12, above includes a plurality of members that are formed by stacked laminations to form a conductor receiving space 26. Members of distinction include the end members 14' and 22' that form facing end surfaces 25' and 27'. To this end, referring specifically to FIGS. 11 and 12, instead of forming passageways (e.g., 28 and 30 in FIG. 5) that traverse the entire thickness $T_g$ of core 12, ends 25' and 27' form recesses 50 and 51 that are elongate but are closed at their ends. Each of members 14' and 22' has an external surface 35, 37 which faces in a direction opposite conductor receiving space 26. The edge formed by outer surface 35 and surface 25' is tapered inwardly toward recess 53 as illustrated, thereby forming a sloped bearing surface 32. Similarly, a sloped bearing surface 34 that slopes toward recess 50 is formed at the edge where outer surface 37 and surface 27' converge. Other than these distinctions, members 14' and 22' are substantially identical to members 14 and 22 described above.

Figure 8:
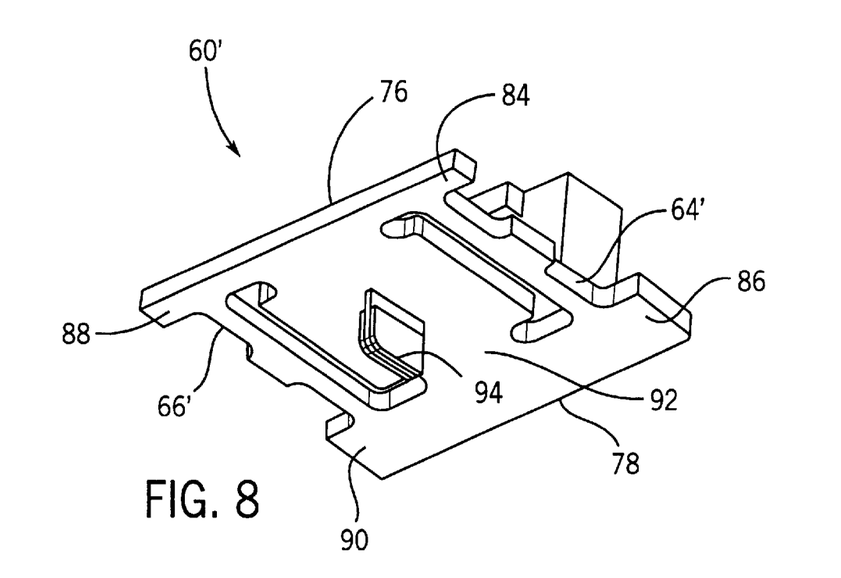
FIG. 8 is a perspective view of the clip assembly of FIG. 7.
Figure 9:
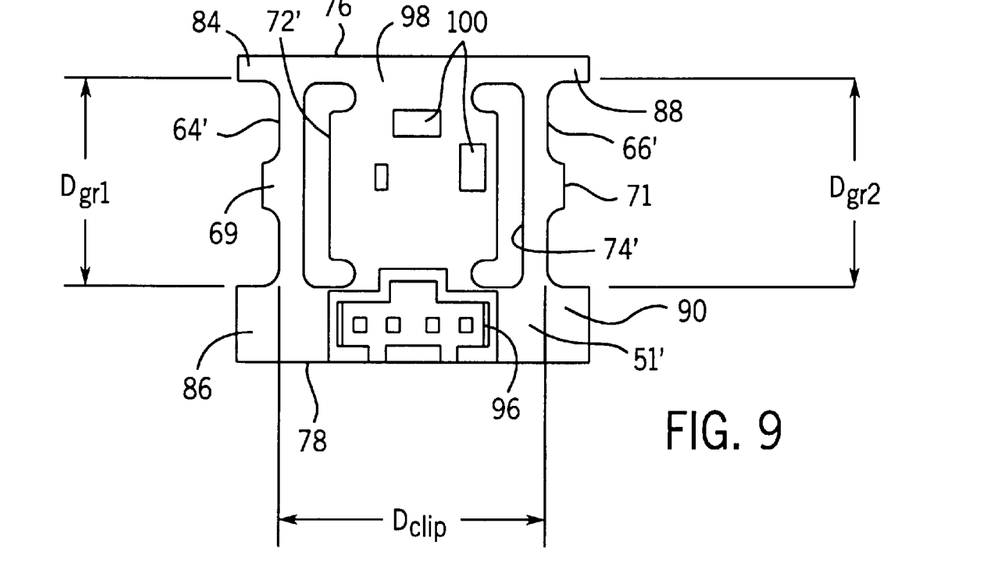
FIG. 9 is a top plan view of the clip assembly of FIG. 8.
Figure 10:
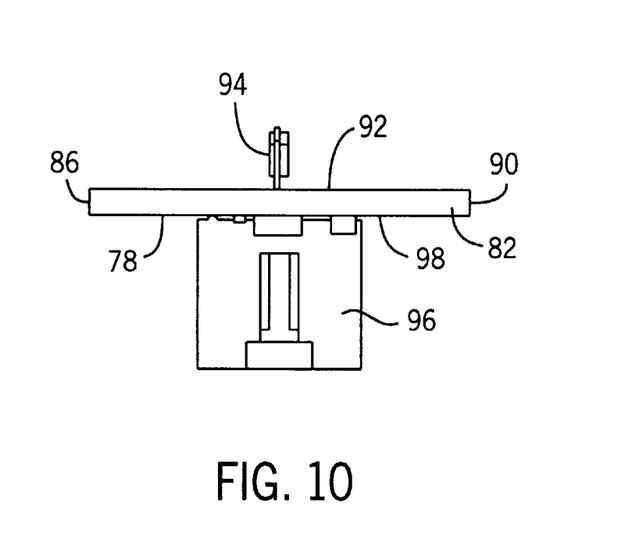
FIG. 10 is a side plan view of the clip assembly of FIG. 8.
Figure 11:
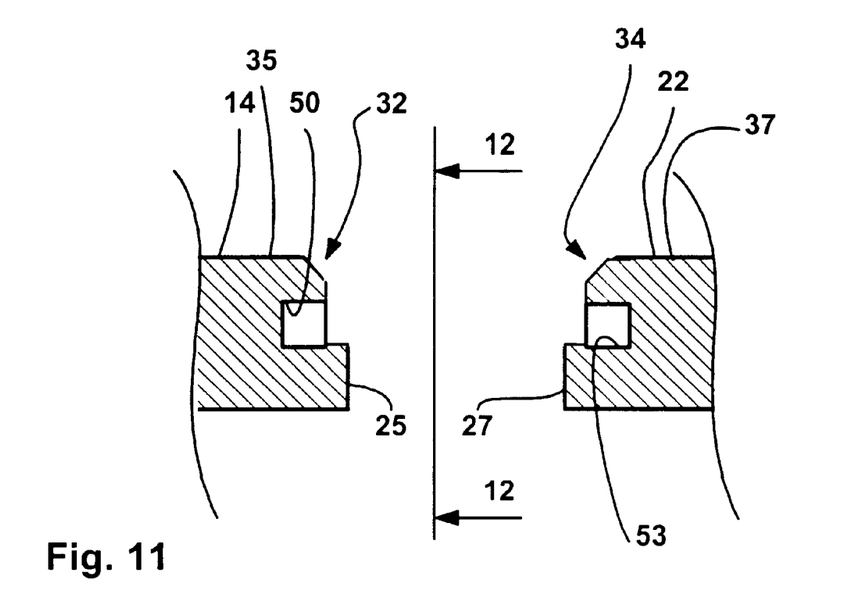
FIG. 11 is a partial cross-sectional view taken along the line 11—11 of FIG. 7 illustrating only the facing ends of the core.

Referring now to FIGS. 8, 9 and 10, second clip assembly 60', like clip assembly 60 described above, is substantially rectilinear, is formed of resilient plastic or circuit board material, includes first and second oppositely facing edges 66' and 68', third and fourth oppositely facing edges 76 and 78 that traverse the distance between first and second edges 66' and 68', respectively, and first and second sides 92 and 98 that are formed and fitted to receive flux sensor 94 and a plug socket 96, (and perhaps other circuitry 100), respectively. First and second U-shaped slots 72' and 74' are generally elongate, extending substantially parallel to edges 64' and 66', respectively, and opening concavely toward each other. Each of slots 72' and 74' is closed proximate each of the third and fourth edges 76 and 78, respectively such that the portions of clip member 51' proximate edges 64' and 66' form leaf springs that are resilient and temporarily deformable.

First and second restraining members 84 and 86 extend laterally and in the same direction from opposite ends of edge 64' away from edge 66'. As in the case of clip member 51 above, restraining members 84 and 86 form facing surfaces that define a first guide receiving dimension $D_{gr1}$ that is substantially identical the guide thickness $T_g$ (see FIG. 12). Referring still to FIG. 9, third and fourth restraining members 88 and 90 extend laterally and in the same direction from opposite ends of edge 66' and define a second guide receiving dimension $D_{gr2}$ that is substantially similar to guide thickness $T_g$.

Figure 12:
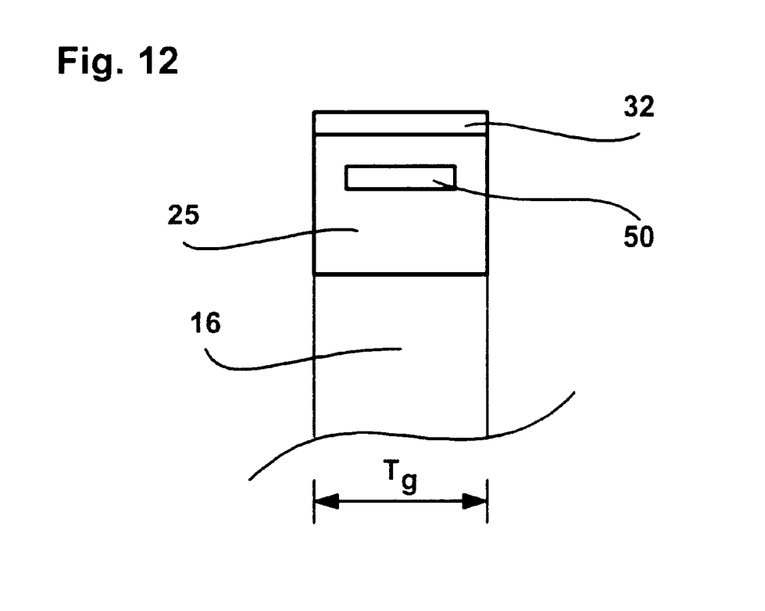
FIG. 12 is a partial view of one end of the core of FIG. 11 taken along the line 12—12.

Referring again to FIGS. 8 and 9, a first retaining member 69 extends laterally and in the same direction from first edge 64' as does restraining members 84 and 86 and is positioned essentially equispaced from members 84 and 86. Referring also to FIG. 12, member 69 is positioned such that, when end 25' is received between restraining members 85 and 86, member 69 is received within recess 50. In a similar fashion a second retaining member 71 extends from between restraining members 88 and 90 in the same direction as members 88 and 90 from edge 66'. Retaining member 71 is positioned along edge 66' such that member 71 is received within recess 51 when end 27' is received between restraining members 88 and 90.

With the clip member 51' and core 12' configured as described above, assembly 60' is mounted securely within the gap formed between ends 25' and 27' in the following manner. First, clip member 51' is positioned such that retaining members 69 and 71 are received on bearing surfaces 32 and 34 with sensor 94 extending downward and into the space between ends 25' and 27'. Here the edges of members 69 and 71 that rest on surfaces 32 and 34 are clip bearing surfaces. Next, force is applied to clip member 51' forcing member 51' along a trajectory that is substantially perpendicular to the length of recesses 50 and 53 to drive member 51' down and between ends 25' and 27'. When force is applied in this manner, members 69 and 71 bend upwardly and are deformed until members 69 and 71 are aligned with recesses 50 and 53. Once aligned with recesses 50 and 53, the force applied to members 69 and 71 substantially ceases and members 69 and 71 resiliently spring back their initial configuration such that members 69 and 71 are received within recesses 50 and 53.

Referring again to FIGS. 1 through 5, it has also been recognized that the core 12 can be dimensioned such that a single clip 60 and a single sensor 94 can be used to sense currents of various magnitudes. To this end, as well known in the art, sensors like sensor 94 are designed to sense flux within a specific range and, if flux is outside the expected range, the sensor will not operate properly. In most applications the current that will pass through a conductor and to be sensed via the inventive assembly will be within an expected current range that can be anticipated. Also, as well known in the art, the amount of flux passing across a core gap given a specific current passing through a conductor that extends through the space 26 is related to the sensing dimension $D_s$. Given a specific current magnitude, a large dimension $D_s$ reduces the flux passing between ends of core 12 while a smaller dimension $D_s$ increases the flux.

Thus, the sensing dimension of core 12 can be changed while employing a single clip/sensor configuration to enable the single clip/sensor configuration to be used to sense various current levels. For instance, given a first relatively low anticipated current magnitude within a first expected current range, a first core having a first relatively small sensing dimension $D_s$ may be employed so that the flux that results across the sensing dimension $D_s$ is within the sensor's optimal sensing range. Similarly, given a second relatively high anticipated current magnitude within a second expected current range, a second core having a second relatively large sensing dimension $D_s$ may be employed so that the flux that results across the sensing dimension is again within the sensor's optimal sensing range.

Importantly, to employ the same clip/sensor configuration in each of these two exemplary cases and in other exemplary cases for that matter, the gap dimension Dg formed by each of the cores would be identical. Thus, for instance, referring again to FIG. 5, in the example above, dimension Dg would be identical for each of the first and second cores while sensing dimension Ds would be smaller for the first core (i.e., where the expected current magnitude is relatively low) than it would be for the second core (i.e., where the expected current magnitude is relatively high).

It should be understood that the methods and apparatuses described above are only exemplary and do not limit the scope of the invention, and that various modifications could be made by those skilled in the art that would fall under the scope of the invention. For example, in at least one embodiment the core ends (e.g., 25, 27) may form both passageways and relatively deeper recesses within the passageways. In addition, other slot configurations are contemplated. Moreover, while sensor 94 is shown on a side of the clip member facing space 26 which helps to protect the sensor 94, in some embodiments sensor 94 may be on the outer side of the clip member. Furthermore, the clip member and core may be configured with couplers that enable the clip member to be mounted on a different angle with respect to the guide ends. For instance, in FIG. 1, clip 51 may be rotated 90° so that the leg members 68 and 70 extend toward space 26.

To apprise the public of the scope of this invention, the following claims are made:

What is claimed is:

1. An apparatus for use with a rigid magnetically permeable core extending between facing first and second ends and formed about a conductor receiving space, the first and second ends defining a sensing gap therebetween having a sensing gap dimension, the apparatus for sensing flux passing through the sensing gap, the apparatus comprising:

a resilient clip member including first and second clip couplers at oppositely facing first and second edges, respectively, the first and second clip couplers formed to be operably received by the first and second core ends, respectively, to mount the clip within the sensing gap with a sensing space formed on a first side of the clip member between the first and second ends; and a flux sensor mounted to the first side of the clip member substantially within the sensing space.

2. The apparatus of claim 1 wherein the first and second ends form first and second guide couplers, respectively, the first and second guide couplers formed to operably receive the first and second clip couplers, respectively.

3. The apparatus of claim 2 wherein the core has a guide thickness, the first clip coupler including first and second restraining members that extend from opposite ends of and in a first direction from the first edge, the second clip coupler including third and fourth restraining members that extend from opposite ends of and in a second direction opposite the first direction from the second edge, the first and second restraining members and the third and fourth restraining members defining first and second guide receiving spaces, respectively, that are each substantially similar to the guide thickness wherein the guide is received within the guide receiving spaces.

4. The apparatus of claim 3 wherein the clip member forms a first slot that is substantially parallel to the first edge.

5. The apparatus of claim 4 wherein the clip member forms a second slot that is substantially parallel to the second edge, a body member is formed between the slots and the sensor is mounted to the body member.

6. The apparatus of claim 5 wherein the clip member includes third and fourth edges that traverse the distances between the first and third and the second and fourth restraining members, respectively, and, wherein, the first and second slots are open to the third edge and are closed at the fourth edge thereby forming first and second leg members on opposite sides of the body member, respectively.

7. The apparatus of claim 6 wherein the first and third restraining members are tapered toward each other at distal ends of the leg members.

8. The apparatus of claim 6 wherein the first and second guide couplers include first and second substantially parallel passageways formed by the core at the first and second ends, respectively, the first and second passageways including first and second facing internal surfaces, respectively, the internal surfaces defining the mounting gap dimension, the first and second leg members received within the first and second passageways, respectively.

9. The apparatus of claim 8 wherein each of the leg members is characterized by a clip thickness and wherein each of the passageways is characterized by a passageway width that is substantially similar to the clip thickness.

10. The apparatus of claim 9 wherein a circuit space is formed on a second side of the clip member opposite the first side of the clip member and wherein the first and second ends define a smaller gap on the first side of the clip member than on the second side of the clip member.

11. The apparatus of claim 1 wherein the clip member is a circuit board and includes an electrical plug electrically linked to the sensor.

12. The apparatus of claim 5 wherein the clip member includes third and fourth edges that traverse the distances between the first and third and the second and fourth restraining members, respectively and, wherein, the first and second slots are closed at each of the third and fourth edges thereby forming first and second spring members on opposite sides of the body member, respectively.

13. The apparatus of claim 12 wherein each slot is substantially U shaped and the U shaped slots open concavely toward each other.

14. The apparatus of claim 12 further including a first retaining member extending from the first edge and between and in the same direction as the first and second restraining members and a second retaining member extending from the second edge and between and in the same direction as the third and fourth restraining members.

15. The apparatus of claim 14 wherein the first and second guide couplers include first and second recesses formed by the core at the first and second ends, respectively, the first and second recesses including first and second facing internal surfaces, respectively, the internal surfaces defining the mounting gap dimension, the first and second retaining members received within the first and second recesses, respectively.

16. The apparatus of claim 15 wherein each of the first and second recesses is elongated and the recesses are substantially parallel.

17. The apparatus of claim 16 wherein a circuit space is formed on a second side of the clip member opposite the first side of the clip member and the first and second ends include first and second edges on the circuit space side of the clip member that are substantially parallel to the first and second recesses and wherein the first and second edges are tapered toward the mounting gap.

18. The apparatus of claim 17 wherein each of the retaining members is characterized by a clip thickness and wherein each of the recesses is characterized by a recess width that is substantially similar to the clip thickness.

19. The apparatus of claim 18 wherein the first and second ends define a smaller gap on the first side of the clip member than on the second side of the clip member.

20. The apparatus of claim 1 further including a plug socket extending from a second side of the clip member opposite the first side and that is electrically linked to the sensor.

21. The apparatus of claim 20 wherein at least a portion of the clip member extends outside the gap and wherein the socket is mounted to the clip member outside the gap.

22. The apparatus of claim 1 wherein the first and second ends of the core form a sensing dimension within the sensing space, the sensor is constructed to sense flux within a flux range and a current magnitude within an expected current range through the conductor is anticipated and, wherein the sensing dimension is selected such that a current within the expected current range causes a flux within the flux range.

23. A method for configuring a current sensor assembly for sensing the flux of a magnetic field formed by current passing through a conductor, the method comprising the steps of:

providing a rigid magnetically permeable guide core extending between facing first and second ends and formed about a conductor receiving space, the first and second ends forming first and second guide couplers, respectively, and defining a mounting gap therebetween having a mounting gap dimension;

providing a resilient clip member including first and second clip couplers at oppositely facing first and second edges, respectively, the first and second guide couplers configured to operably receive the first and second clip couplers, respectively, to mount the clip within the mounting gap with a sensing space formed on a first side of the clip member between the first and second ends; and mounting a sensor to the first side of the clip member;

positioning the conductor within the conductor receiving space; and engaging the first guide and first clip couplers and the second guide and second clip couplers to secure the clip member between the first and second ends with the sensor substantially residing between the first and second ends.

24. The method of claim 23 wherein the step of providing the clip member includes providing a clip member having at least a first resilient restraining member extending from the first edge and wherein the step of engaging includes deforming the first restraining member, placing the clip member within the mounting gap with the restraining member proximate the first end and allowing the restraining member to assume its original non-deformed configuration.

25. The method of claim 24 wherein the step of providing the clip member includes providing a clip member having an additional resilient restraining member extending from the second edge in a direction opposite the first restraining member and wherein the step of engaging also includes deforming the additional restraining member, placing the clip member within the mounting gap with the additional restraining member proximate the second end and allowing the additional restraining member to assume its original non-deformed configuration.

26. The method of claim 25 wherein the step of providing a core includes providing first and second facing recesses in the first and second ends and wherein the step of placing the clip member includes placing the clip member such that the first and second clip edges are proximate the first and second recesses.

27. The method of claim 26 wherein each of the restraining members forms a restraining member bearing surface and each of the first and second core ends forms a core bearing surface and wherein the step of deforming includes forcing the restraining member bearing surfaces against the core bearing surfaces until the clip member passes between the first and second ends.

28. The method of claim 27 wherein each of the recesses is elongate and the first and second recesses are substantially parallel and wherein the step of forcing includes forcing the clip member along a trajectory that is substantially parallel to the recesses.

29. The method of claim 27 wherein each of the recesses is elongate and the first and second recesses are substantially parallel and wherein the step of forcing includes forcing the clip member along a trajectory that is substantially perpendicular to the recesses.

30. An apparatus for sensing magnetic field flux formed by current passing through a conductor, the apparatus comprising:

a rigid flux guide core extending between facing first and second ends and formed about a conductor receiving space, the first and second ends defining a mounting gap therebetween having a mounting gap dimension;

a resilient clip member including oppositely facing first and second edges and first and second oppositely facing sides;

first and second securing means for securing the first and second edges to the first and second ends, respectively, with a sensing space formed on a first side of the clip member between the first and second ends; and a sensor mounted to the first side of the clip member substantially within the sensing space.

31. The apparatus of claim 30 wherein the first and second ends of the core form a sensing dimension within the sensing space, the sensor is constructed to sense flux within a flux range and a current magnitude within an expected current range through the conductor is anticipated and, wherein the sensing dimension is selected such that a current within the expected current range causes a flux within the flux range.

32. An apparatus for use with a rigid magnetically permeable core extending between facing first and second ends and formed about a conductor receiving space, the first and second ends defining a sensing gap therebetween having a sensing gap dimension, the apparatus for sensing flux passing through the sensing gap, the core having a core thickness, the apparatus comprising:

a resilient clip member including first and second clip couplers at oppositely facing first and second edges, respectively, the first and second clip couplers formed to be operably received by the first and second core ends, respectively, to mount the clip within the sensing gap with a sensing space formed on a first side of the clip member between the first and second ends, the first clip coupler including first and second restraining members that extend from opposite ends of and in a first direction from the first edge, the second clip coupler including third and fourth restraining members that extend from opposite ends of and in a second direction opposite the first direction from the second edge, the first and second restraining members and the third and fourth restraining members defining first and second guide receiving spaces, respectively, that are each substantially similar to the guide thickness wherein the guide is received within the guide receiving spaces, the clip member forming a first slot that is substantially parallel to the first edge, the dip member including third and fourth edges that traverse the distances between the first and third and the second and fourth restraining members, respectively, and, wherein, the first slot is open to the third edge and is closed at the fourth edge thereby forming a first leg member; and a flux sensor mounted to the first side of the clip member substantially within the sensing space.

33. The apparatus of claim 32 wherein the clip member forms a second slot that is substantially parallel to the second edge, a body member is formed between the slots, the sensor is mounted to the body member, the second slot is open to the third edge and is closed at the fourth edge thereby forming a second leg member on a side of the body member opposite the first leg member.

34. The apparatus of claim 33 wherein the first and third restraining members are tapered toward each other at distal ends of the leg members.

35. The apparatus of claim 33 wherein the first and second guide couplers include first and second substantially parallel passageways formed by the core at the first and second ends, respectively, the first and second passageways including first and second facing internal surfaces, respectively, the internal surfaces defining the mounting gap dimension, the first and second leg members received within the first and second passageways, respectively.

36. The apparatus of claim 35 wherein each of the leg members is characterized by a clip thickness and wherein each of the passageways is characterized by a passageway width that is substantially similar to the clip thickness.

37. The apparatus of claim 36 wherein a circuit space is formed on a second side of the clip member opposite the first side of the clip member and wherein the first and second ends define a smaller gap on the first side of the clip member than on the second side of the clip member.

* * * * *